United States Patent
Hayashi

(10) Patent No.: US 7,465,989 B2
(45) Date of Patent: Dec. 16, 2008

(54) HIGH WITHSTAND VOLTAGE TRENCHED MOS TRANSISTOR AND MANUFACTURING METHOD THEREOF

(75) Inventor: Keiji Hayashi, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/902,583

(22) Filed: Sep. 24, 2007

(65) Prior Publication Data

US 2008/0073706 A1    Mar. 27, 2008

(30) Foreign Application Priority Data

Sep. 26, 2006    (JP) .............................. 2006-261560

(51) Int. Cl.
*H01L 27/108*    (2006.01)
(52) U.S. Cl. .................. 257/330; 257/331; 257/332; 257/333; 257/334; 257/213; 257/E29.201
(58) Field of Classification Search .................. 257/330, 257/331, 332, 333, 334, E29.201, 213
See application file for complete search history.

(56) References Cited

FOREIGN PATENT DOCUMENTS

| JP | 04-251980 | 9/1992 |
|---|---|---|
| JP | 2004-039985 | 2/2004 |

*Primary Examiner*—Evan Pert
*Assistant Examiner*—Tan N Tran
(74) *Attorney, Agent, or Firm*—Harness, Dickey & Pierce, P.L.C.

(57) ABSTRACT

A high withstand voltage transistor includes: a gate electrode provided in a trench formed on a semiconductor substrate; a source and a drain which are respectively formed on a side of the gate electrode and another side of the gate electrode, and which are a predetermined distance away from the gate electrode; first electric field relaxation layers one of which is formed on a wall of the trench on the side of the source and another one of which is formed on a wall of the trench on the side of the drain; and second electric field relaxation layers one of which is formed between the source and the gate electrode, and another one of which is formed between the drain and the gate electrode.

9 Claims, 12 Drawing Sheets

PRIOR ART FIG. 15
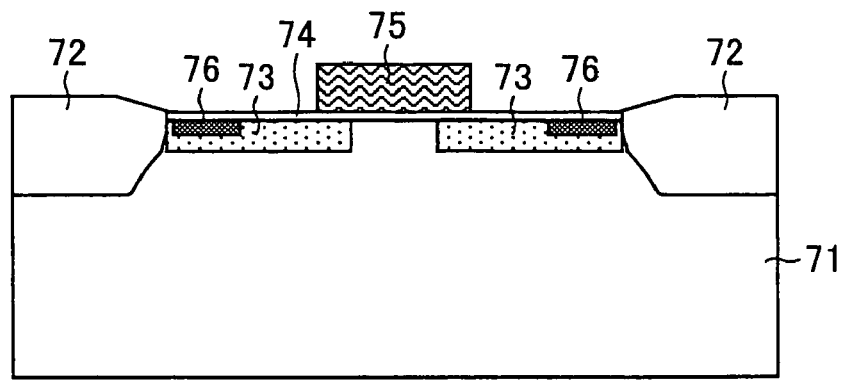
PRIOR ART FIG. 16
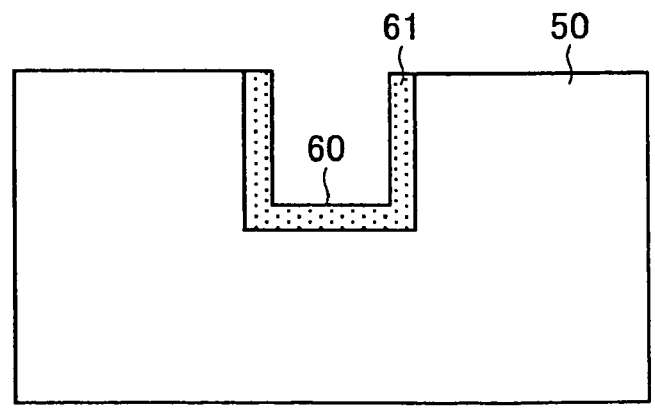

PRIOR ART   FIG. 17
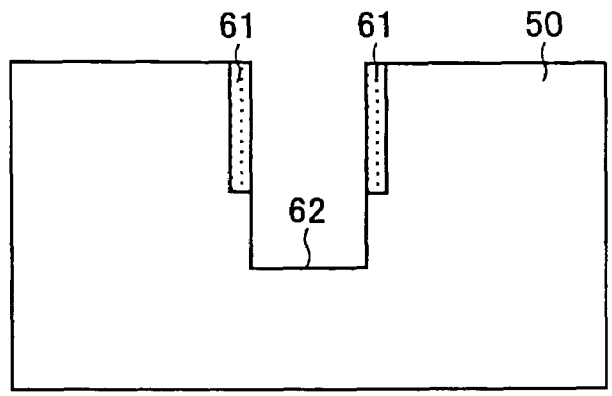
PRIOR ART   FIG. 18
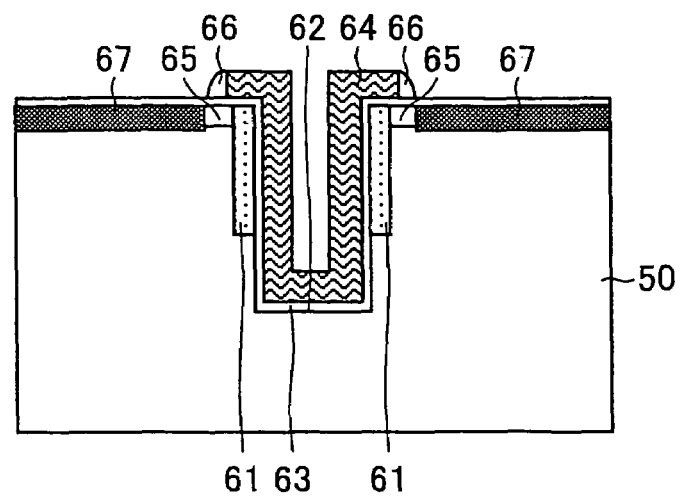

PRIOR ART    FIG. 19
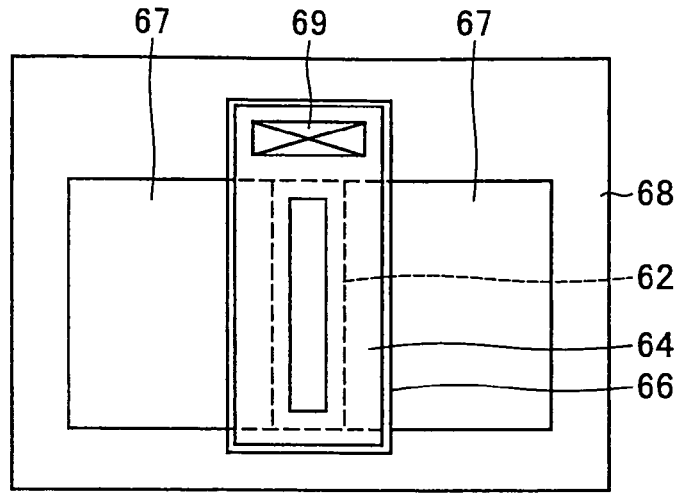
PRIOR ART    FIG. 20
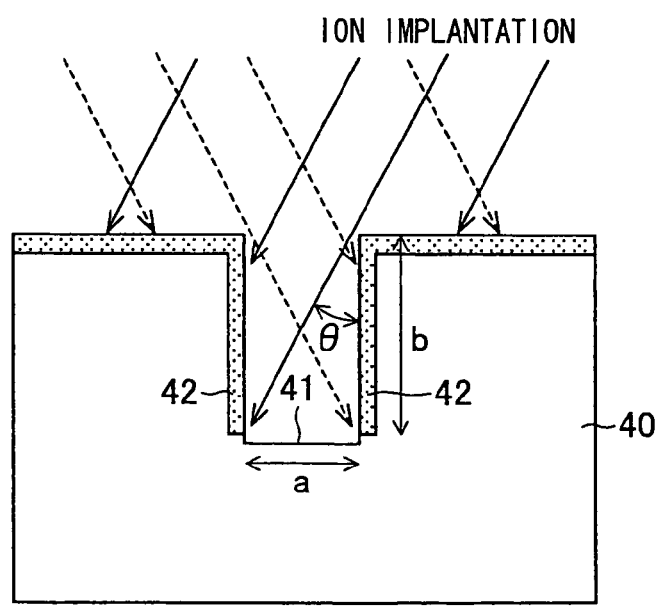
$b = a / \tan \theta$

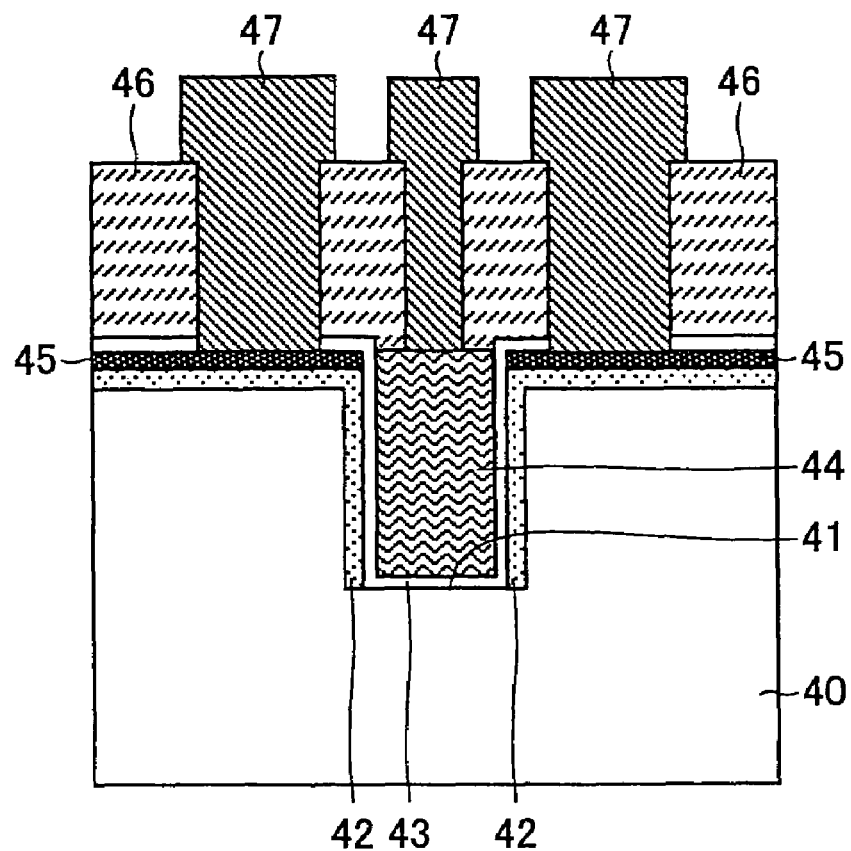
PRIOR ART FIG. 21

US 7,465,989 B2

HIGH WITHSTAND VOLTAGE TRENCHED MOS TRANSISTOR AND MANUFACTURING METHOD THEREOF

This Nonprovisional application claims priority under 35 U.S.C. § 119(a) on Patent Application No. 2006/261560 filed in Japan on Sep. 26, 2006, the entire contents of which are hereby incorporated by reference.

FIELD OF THE INVENTION

The present invention relates to a high withstand voltage transistor and its manufacturing method. More specifically, the present invention relates to a high withstand voltage transistor of a liquid crystal driver or the like, which transistor has a trench structure, and relates to a method of manufacturing such a high withstand voltage transistor.

BACKGROUND OF THE INVENTION

Semiconductor devices each functions as a high withstand voltage MOS transistor have been conventionally proposed. As shown in FIG. 15, the high withstand voltage MOS transistor is provided with a silicon substrate 71 which includes an isolation region 72 for element isolation and electric field relaxation layers 73. The silicon substrate 71 further has a gate electrode 75 and a gate oxidized film 74. The gate electrode 75 is formed in such a manner that two ends thereof respectively overlap the electric field relaxation layers 73, and the gate oxidized film 74 is interposed between the gate electrode 75 and the electric field relaxation layers 73. On two sides of the gate electrode 75, source and drain regions 76 having so-called offset structure is provided a certain distance away from the gate electrode 75. Usually, to ensure a high withstand voltage, the gate length and the size of the electric field relaxation layer 73 are increased to a certain degree, in the high withstand voltage MOS transistor having the above structure.

On the other hand, for example, Patent Citation 1 (Japanese Unexamined Patent Publication No. 251980/1992 (Tokukaihei 4-251980; Published on Sep. 8, 1992)) proposes a high withstand voltage MOS transistor using a trench for a purpose of achieving a higher integration. As shown in FIG. 16, to form the high withstand voltage MOS transistor, a trench 60 is first formed on an N-type semiconductor substrate 50, and then P-type impurity diffusion layers 61 are formed on side and bottom surfaces of the trench 60. Next, as shown in FIG. 17, the bottom surface of the trench 60 is further deepened to form a trench 62. Then, as shown in FIG. 18, an oxidized film 63 is formed through a thermal oxidation or the like on the outer layer including the side and bottom surfaces of the trench 62. Then, a polysilicon film is formed through a CVD method on the entire superior surface of the semiconductor substrate 50 including the trench 62. The polysilicon film is patterned into a gate electrode 64 through photo lithography and etching. A low concentration diffusion layer 65 for P-LDD is formed. At the ends of the gate electrode 64, side walls 66 are formed. Then, through a conventional manufacturing method, P-type high concentration impurity diffusion layers 67 are formed. Thus, a P-type high withstand voltage MOS transistor as shown in FIG. 18 and FIG. 19 is obtained.

The P-type high withstand voltage MOS transistor thus obtained has the gate electrode 64 which is formed so as to cover the trench 62. At the ends of the gate electrode 64, the side walls 66 are provided. Adjacently to the side walls 66, the P-type high concentration impurity layers 67 to become source and drain regions are arranged. The P-type high concentration impurity layers 67 and the trench 62 are surrounded by an isolation region 68 formed through LOCOS method. In a region where the gate electrode 64 overlaps the isolation region 68, a contact region 69 to be connected to metal wiring is formed.

Since this high withstand voltage MOS transistor has the P-type impurity diffusion layers 61 which serve as electric field relaxation layers on the side surfaces of the trench 62, an area taken by the transistor is reduced. However, since the trench 62 is formed by further deepening the trench 60 after the trench 60 is formed, the process of manufacturing becomes complicated. This consequently raises the production cost and decreases the yield.

Further, it is necessary to form the side wall on each side surface of the gate electrode 64, and to form the contact region 69 on the isolation region 68 for connecting the gate electrode 64 to metal wiring. This reduces an amount by which the high withstand voltage MOS transistor is downsized.

In order to solve the problem, for example, Japanese Unexamined Patent Publication No. 2004-39985 (Tokukai 2004-39985; Published on Feb. 5, 2004) (Patent Citation 2) proposes a high withstand voltage MOS transistor in which a drift diffusion region is formed on walls of a trench, by implanting ion at an oblique angle. As shown in FIG. 20, in the high withstand voltage MOS transistor, a trench 41 is formed on a semiconductor substrate 40, and a drift diffusion layer 42 is formed on the walls of the trench 41, by implanting ion at an oblique angle. At this point, the ion is not implanted to the bottom of the trench 41. This is because the edges at the top of the trench 41 block implantation of the ion into the bottom surface.

Then, as shown in FIG. 21, a gate oxidized film 43 is formed on the walls and the bottom surface of the trench 41, and a gate electrode 44 is buried into the trench 41. Then, through ion implantation, a high concentration impurity diffusion layer 45, an interlayer insulation film 46 and drain/source/gate electrode wiring 47 are formed. Thus, a high withstand voltage MOS transistor as shown in FIG. 21 is obtained.

The high withstand voltage MOS transistor shown in FIG. 21 allows a high integration, and its manufacturing method is simplified. However, since the gate electrode 44 is adjacent to the high concentration impurity diffusion layer 45, the withstand voltage of the high withstand voltage MOS transistor is deteriorated due to an effect from the electric field at the gate electrode 44. It is therefore difficult to achieve a higher withstand voltage.

Further, as shown in FIG. 20, in formation of the drift diffusion layer 42 by implantation of ion into the walls of the trench 41 at an oblique angle, the following relation is established: (b=a/tan θ), where: θ is an implantation angle at which ion is implanted to form the drift diffusion layer 42; a is a gate length (trench 41 width); and b is a length of the drift diffusion layer 42. Accordingly, determining of the depth of the trench 41 determines one gate length (trench 41 width). Accordingly, a circuit (e.g. an output circuit of a liquid crystal driver) which is largely affected by variation in characteristics of the transistor is not able to adopt the above-described downsized high withstand voltage transistor. This is because, when designing such a circuit, it is not possible to increase the gate length to reduce an effect of variation in the accuracy of processing in the manufacturing process.

SUMMARY OF THE INVENTION

An object of the present invention is to provide a high withstand voltage transistor and a manufacturing method thereof, each of which solves the foregoing problems and allows downsizing of the transistor.

In order to achieve the foregoing object, a high withstand voltage trenched MOS transistor of the present invention, includes: a trench formed on a semiconductor substrate and a gate oxidized film formed in a surface portion of the trench; a gate electrode formed on the gate oxidized film in the trench; first electric field relaxation layers one of which is formed in a surface portion of the semiconductor substrate adjacent to one side of the gate electrode, and another one of which is formed in a surface portion of the semiconductor substrate adjacent to another side of the gate electrode; second electric field relaxation layers each of which is formed along a wall of the trench in a region having the gate electrode, and is connected to one of the first electric field relaxation layers; an insulation film covering the gate electrode; and a source region and a drain region one of which is formed so as to be included in a surface portion of one of the first electric field relaxation layers provided on the side of the gate electrode, and another one of which is formed so as to be included in a surface portion of another one of the first electric field relaxation layers provided on the other side of the gate electrode.

In order to achieve the foregoing object, a high withstand voltage trenched MOS transistor of the present invention, includes: a trench formed on a semiconductor substrate and a gate oxidized film formed on walls of the trench; a gate electrode formed on the gate oxidized film in the trench and is extended to regions of the semiconductor substrate adjacent to the trench; a side wall formed on one side of the extended portion of the gate electrode on the semiconductor substrate, and another side wall formed on another side of the extended portion of the gate electrode; first electric field relaxation layers one of which is formed in a surface portion of the semiconductor substrate adjacent to one side of the gate electrode, and another one of which is formed in a surface portion of the semiconductor substrate adjacent to another side of the gate electrode; second electric field relaxation layers each of which is formed along one of the walls of the trench having the gate electrode, and is connected to one of the first electric field relaxation layers; and a source region and a drain region one of which is formed so as to be included in a surface portion of one of the first electric field relaxation layers provided on the side of the gate electrode, and another one of which is formed so as to be included in a surface portion of another one of the first electric field relaxation layers provided on the other side of the gate electrode.

In order to achieve the foregoing object, a high withstand voltage trenched MOS transistor of the present invention, includes: a trench formed on a semiconductor substrate and a gate oxidized film formed on walls of the trench; a gate electrode formed on the gate oxidized film in the trench so that a top surface of the gate electrode is lower than surface portions of the semiconductor substrate adjacent to the trench; a side wall formed on the top surface of the gate electrode and is extended along one of the walls of the trench; first electric field relaxation layers one of which is formed in a surface portion of the semiconductor substrate adjacent to one side of the gate electrode, and another one of which is formed in a surface portion of the semiconductor substrate adjacent to another side of the gate electrode; second electric field relaxation layers each of which is formed along one of the walls of the trench having the gate electrode, and is connected to one of the first electric field relaxation layers; and a source region and a drain region one of which is formed so as to be included in a surface portion of one of the first electric field relaxation layers provided on the side of the gate electrode, and another one of which is formed so as to be included in a surface portion of another one of the first electric field relaxation layers provided on the other side of the gate electrode.

In order to achieve the foregoing object, a method of the present invention for manufacturing a high withstand voltage transistor, includes the steps of: (I) forming a trench on a first conductive semiconductor substrate and burying a CVD oxidized film; (II) forming second electric field relaxation layers by implanting a second conductive ion along walls on two sides of the trench in a transistor formation region, using resist as a mask; (III) removing the CVD oxidized film from the trench in the transistor formation region, and forming a gate oxidized film on the walls and the bottom surface of the trench exposed on the semiconductor substrate; (IV) burying a gate electrode in the trench; (V) forming an insulation film having an intended width for covering the gate electrode; (VI) forming first electric field relaxation layers by implanting a second conductive ion, using the insulation film as a mask; and (VII) forming a source region and a drain region by implanting a second conductive ion, using the insulation film as a mask.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 15 is a cross sectional view showing a configuration of the conventional high withstand voltage transistor.

FIG. 16 is a cross sectional view for explaining a manufacturing method of yet another conventional high withstand voltage transistor.

FIG. 17 is a cross sectional view for explaining a manufacturing method of yet another conventional high withstand voltage transistor.

FIG. 18 is a cross sectional view for explaining a manufacturing method of another conventional high withstand voltage transistor.

FIG. 19 is a plane view for explaining a configuration of the other conventional high withstand voltage transistor.

FIG. 20 is a cross sectional view for explaining a manufacturing method of the other conventional high withstand voltage transistor.

FIG. 21 is a cross sectional view for explaining a manufacturing method of the other conventional high withstand voltage transistor.

DESCRIPTION OF THE EMBODIMENTS

Embodiment 1

An embodiment of the present embodiment is described below with reference to FIG. 1 to FIG. 14.

Figure 1:
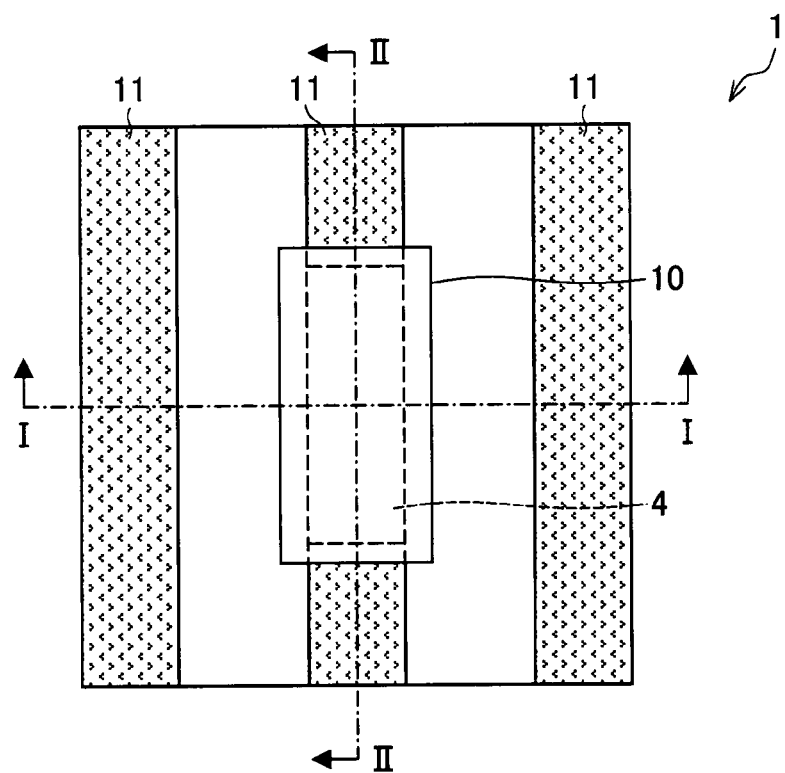
FIG. 1 is a plane view showing a configuration of a high withstand voltage transistor of an embodiment.
Figure 2:
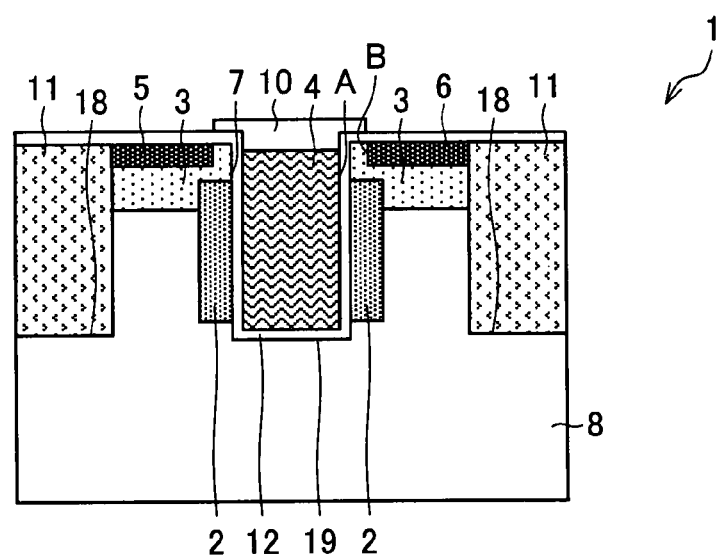
FIG. 2 is a cross sectional view taken along the line I-I shown in FIG. 1.
Figure 3:
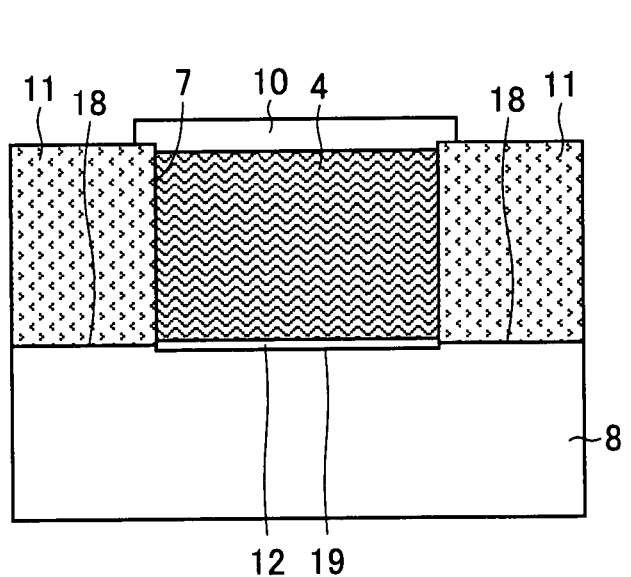
FIG. 3 is a cross sectional view taken along the line II-II shown in FIG. 1.

FIG. 1 is a plane view showing a configuration of a high withstand voltage transistor 1 of the present embodiment. FIG. 2 is a cross sectional view taken along the line I-I of FIG. 1. FIG. 3 is a cross sectional view taken along the line II-II shown in FIG. 1. When viewed the high withstand voltage transistor 1 in the direction perpendicular to the surface of the semiconductor substrate 8, the high withstand voltage transistor 1 includes stripe CVD oxidized films 11 which are arranged in parallel to one another. As shown in FIG. 1 and FIG. 2, a gate electrode 4 is buried in a trench 7 which is formed by cutting the CVD oxidized films 11 arranged in the middle. A gate oxidized film 12 is formed so as to cover the bottom surface and two side surfaces of the trench 7 and the surface of semiconductor substrate 8.

On one side of the gate electrode 4, a source 5 is formed apart from the gate electrode 4 by a predetermined distance. On another side of the gate electrode 4, a drain is formed apart from the gate electrode 4 by a predetermined distance. The source 5 and the drain 6 are exposed on the surface of the semiconductor substrate 8. Along a wall of the trench 7 on the side of the source 5, an electric field relaxation layer 2 is formed at a predetermined depth. Along another wall of the trench 7 on the side of the drain 6, another electric field relaxation layer 2 is formed at a predetermined depth. Each electric field relaxation layer 2 is extended from a depth nearby the bottom surface of the trench 7 up to the depth nearby the lower side of the source 5 or the drain 6. An electric field relaxation layer 3 is formed at a predetermined depth along the wall of the trench 7 on the side of the source 5, and another electric field relaxation layer 3 is formed at a predetermined depth along the other wall of the trench 7 on the side of the drain 6. Each of the electric field relaxation layers 3 is extended to a position deeper than the top surface of the electric field relaxation layer 2. The electric field relaxation layer 3 is formed between the source 5 and the electric field relaxation layer 2, and is extended below the source 5. The other electric field relaxation layer 3 is formed between the drain 6 and the electric field relaxation layer 2, and is extended below the drain 6. Each electric field relaxation layer 2 is formed so as to cut into the electric field relaxation layer 3 towards the source 5 or the drain 6.

The impurity concentration of each electric field relaxation layer 2 is $1\times10^{16}$ to $5\times10^{17}$ cm$^{-3}$, and that of each electric field relaxation layer 3 is $1\times10^{16}$ to $5\times10^{17}$ cm$^{-3}$. As described, the impurity concentrations of the electric field relaxation layer 2 and the electric field relaxation layer 3 are the same.

Each of The CVD oxidized films 11 is buried into the semiconductor substrate 8 to isolate elements. The gate electrode 4 is buried so as to be adjacent to the CVD oxidized film 11 in the middle. Each of the source 5 and the drain 6 is made of an N-type high concentration impurity diffusion layer which becomes a drain/source diffusion region. Further, an insulation film 10 covers the gate electrode 4. The insulation film 10 serves as a mask when a high concentration impurity is implanted into the surface of the semiconductor substrate 8 so as to turn the surface of the semiconductor substrate 8 into the drain/source diffusion region. The direction of the cross section of FIG. 2 taken along the line I-I is the direction of the gate length of the high withstand voltage transistor. The direction of the cross section of FIG. 3 taken along the line II-II is the direction of the gate width of the high withstand voltage transistor.

As shown in the cross section of FIG. 2 in the direction of the gate length of the high withstand voltage transistor, the gate oxidized film 12 is formed through thermal oxidation with respect to the walls and the bottom surface of the trench 7. The gate electrode 4 buried is located above this gate oxidized film 12. The insulation film 10 having an intended width covers the gate electrode 4. The source 5 and the drain 6 are formed on a surface of the semiconductor substrate 8, one of which on one side of the insulation film 10, and another one of which on another side. On each side surface of the trench 7, the electric field relaxation layer 2 is formed. An electric field relaxation layers 3 is formed between the source 5 and the gate electrode 4, and between the source 5 and the electric field relaxation layer 2. Another electric field relaxation layer 3 is also formed between the drain 6 and the gate electrode 4, and between the drain 6 and the electric field relaxation layer 2. A channel region 19 is formed on the bottom surface of the trench 7.

As shown in the cross section of FIG. 3 in the direction of the gate width of the transistor, the sides of the gate electrode 4 is adjacent to the CVD oxidized film 11 for isolating elements. The insulation film 10 having an intended width is formed and covers the gate electrode 4. A channel region 19 is formed on the bottom surface of the gate electrode 4.

Figure 4:
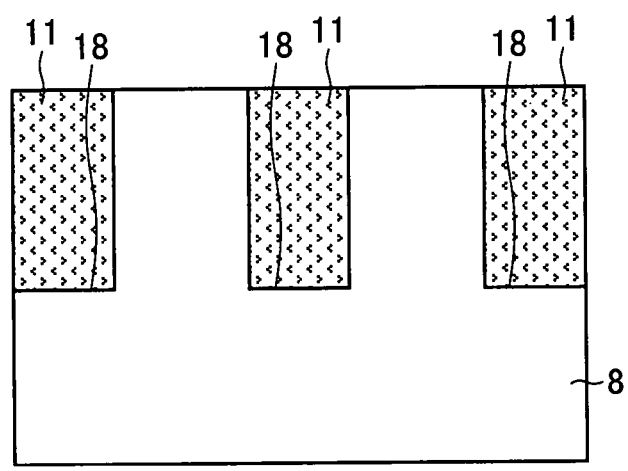
FIG. 4 is a cross sectional view taken along the line I-I for explaining a manufacturing method of the high withstand voltage transistor.

FIG. 4 is a cross sectional view taken along the line I-I for explaining a manufacturing method of the high withstand voltage transistor 1. First, as shown in FIG. 4, trenches 18 of 0.3 to 2 μm in depth for isolating elements are formed on a P-type semiconductor substrate 8. In each of the trenches 18, CVD oxidized films 11 are buried as shown in FIG. 4. For example, the CVD oxidized film 11 may be buried through a CMP process or the like. The width of the trench 18 is, for example, 0.3 to 1 μm. The depth and width of the trench 18 is determined according to the required withstand voltage of the high withstand voltage transistor. Higher the required withstand voltage of the transistor is, the larger the dimension of the trench will becomes. The above exemplified dimension will yield a transistor whose withstand voltage is between 10 to 100V.

The following describes an example of an N-ch transistor whose withstand voltage is 30V. In this example, the width of the trench 18 is 0.4 μm, and the depth of the trench 18 is 0.8 μm.

Figure 5:
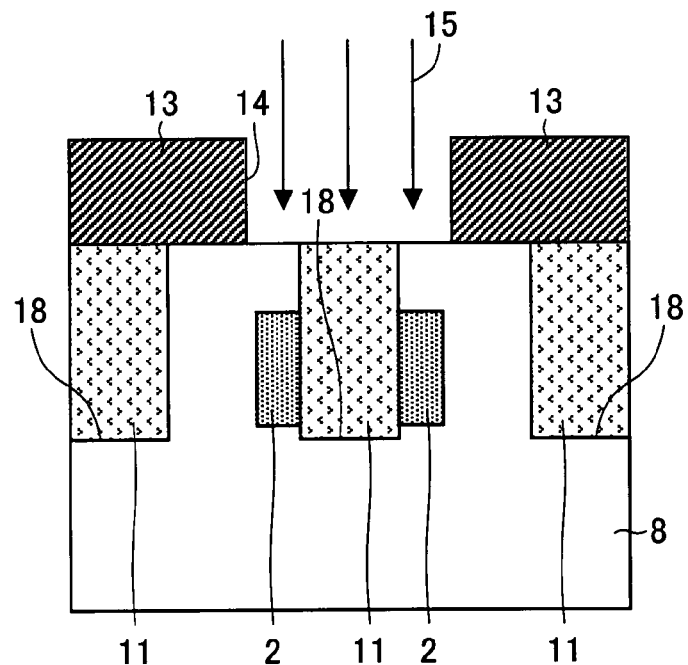
FIG. 5 is a cross sectional view taken along the line I-I for explaining the manufacturing method of the high withstand voltage transistor.
Figure 6:
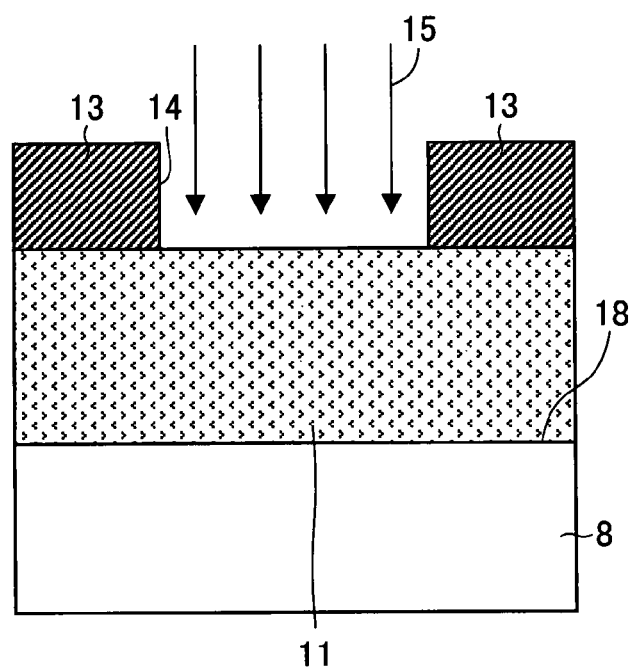
FIG. 6 is a cross sectional view taken along the line II-II for explaining the manufacturing method of the high withstand voltage transistor.

FIG. 5 is a cross sectional view taken along the I-I for explaining the manufacturing method of the high withstand voltage transistor 1. FIG. 6 is a cross sectional view taken along the II-II. Next formed is a photo resist pattern 13 having an opening 14 in a position corresponding to a position where a high withstand voltage transistor will be formed through a photo lithography. Here, the opening 14 of the photo resist pattern 13 is formed so that two sides of the trench 18 are within the region where the opening 14 is formed. For example, the size of the opening 14 is 0.8 to 1.0 μm (the width of the trench 18 (0.4 μm) plus extra 0.2 to 0.3 μm on the two sides of the trench 18). Ion 15 is implanted using the photo resist pattern 13 as a mask, and electric field relaxation layers 2 are formed in lower portions of the walls on the two sides of the trench 18. Each of the electric field relaxation layers 2 is made of a drift diffusion layer. For example, the ion 15 which is phosphorous is implanted at 300 keV into an area of $8.0 \times 10^{12}$ cm$^2$, and at 150 keV into an area of $1.0 \times 10^{13}$ cm$^2$.

Note that the electric field relaxation layer 2 (N-layer) is formed by implanting phosphorous so that an end of the electric field relaxation layer 2 is at substantially 85% of the depth of the trench 18. The end of the electric field relaxation layer 2 may be 80 to 90% of the depth of the trench 18, or 70 to 100% of the depth of the trench 18. Further, the position of the end of the electric field relaxation layer 2 is suitably set in consideration of adjustment to achieve a high withstand voltage of the transistor.

The distribution of the impurity concentration in the semiconductor substrate 8 is achieved as follows. For example, boron is implanted at 50 keV into an area of $1.0 \times 10^{12}$ cm$^2$ of P-type silicon whose specific resistance is 10 Ω cm, at 150 keV into an area of $1.0 \times 10^{12}$ cm$^2$ of the P-type silicon, at 400 keV into an area of $1.0 \times 10^{12}$ cm$^2$ of the P-type silicon, and at 800 keV into an area of $1.0 \times 10^{13}$ cm$^2$ of the P-type silicon. That way, the distribution of the impurity concentration is set so that: the impurity concentration is $5 \times 10^6$ cm$^3$ in a portion of the semiconductor substrate 8 extended from its surface to a position nearby the bottom surface 9 of the trench 7; and the impurity concentration is $1.5 \times 10^{17}$ cm$^3$ in a portion of the semiconductor substrate 8 under the bottom surface of the trenches 7 and 18.

Figure 7:
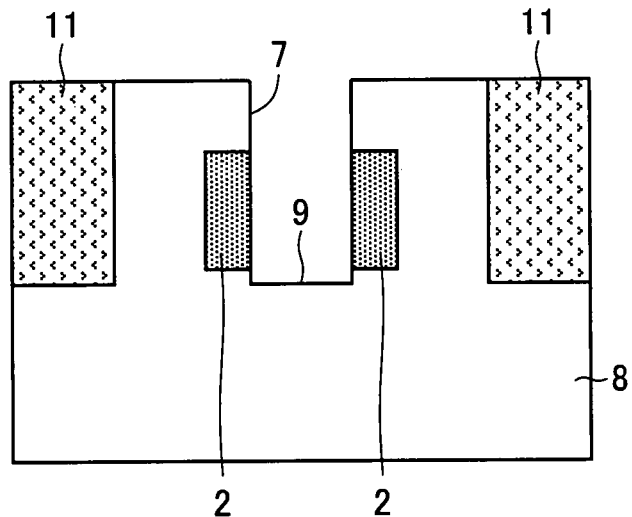
FIG. 7 is a cross sectional view taken along the line I-I for explaining the manufacturing method of the high withstand voltage transistor.
Figure 8:
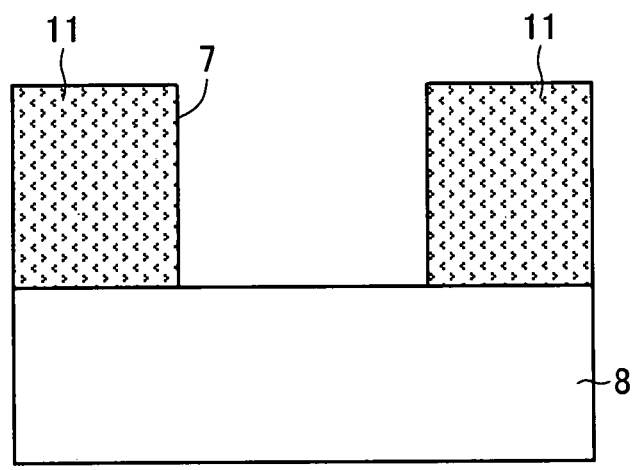
FIG. 8 is a cross sectional view taken along the line II-II for explaining the manufacturing method of the high withstand voltage transistor.

FIG. 7 is a cross sectional view taken along I-I for explaining the manufacturing method of the high withstand voltage transistor 1. FIG. 8 is a cross sectional view taken along the II-II. As shown in FIG. 7 and FIG. 8, a trench 7 is formed by partially removing the CVD oxidized film 11 in the trench 18, using the photo resist pattern 13 as a mask. Here, the width of the trench 7 in FIG. 7 will be the gate length of the high withstand voltage transistor, and the width of the trench 7 in FIG. 8 will be the gate width of the high withstand voltage transistor.

Figure 9:
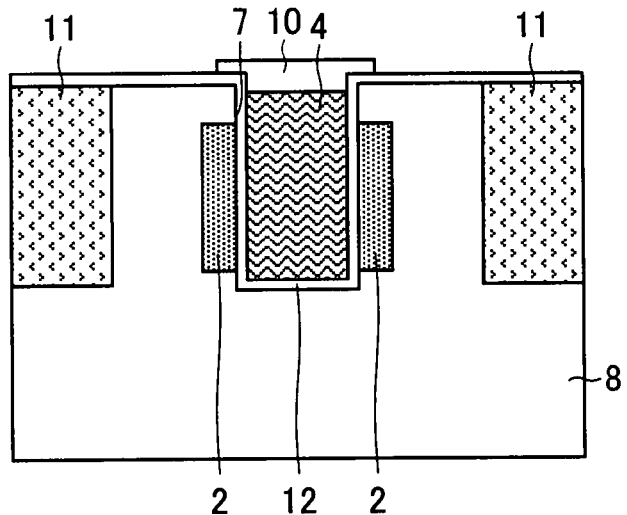
FIG. 9 is a cross sectional view taken along the line I-I for explaining the manufacturing method of the high withstand voltage transistor.
Figure 10:
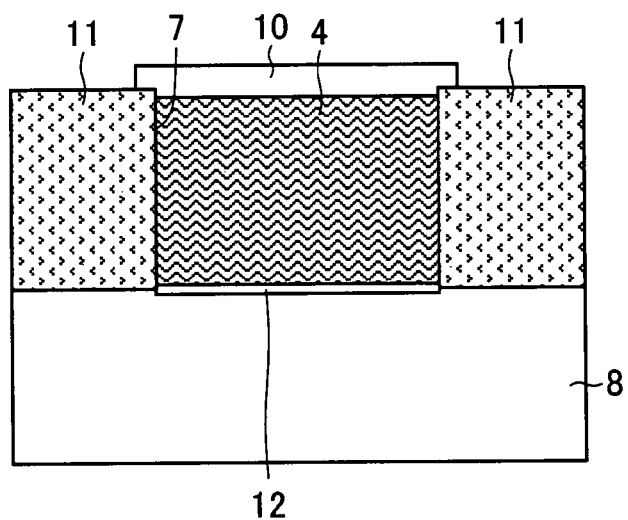
FIG. 10 is a cross sectional view taken along the line II-II for explaining the manufacturing method of the high withstand voltage transistor.

FIG. 9 is a cross sectional view taken along I-I for explaining the manufacturing method of the high withstand voltage transistor 1. FIG. 10 is a cross sectional view taken along the II-II. Through a sacrificial oxidation, the inner walls of the trench 7 are sacrificially oxidized. Then, the inner walls of the trench 7 are again oxidized after removing the sacrificially oxidized film, thus forming a gate oxidized film 12. After that, the gate electrode 4 is buried into the trench 7 through a CMP method for example.

Then, an insulation film for forming a side wall of a logic transistor is deposited, and through a photo lithography, the insulation film 10 is formed so as to cover, for example, 0.1 to 0.3 μm on two sides of the gate electrode 4. Here, for example, the thickness of the sacrificially oxidized film is 20 to 50 nm. The thickness of the gate oxidized film 12 is 50 to 80 nm. For example, when the insulation film 10 is a CVD oxidized film, the thickness of the insulation film 10 is 100 nm. However, the insulation film 10 may be a CVD SiN film, a CVD SiN/SiO$_2$ compound film. Note however that the thickness of the insulation film 10 must be such that the later-described ion 16 is blocked but that a third ion 17 is able to go through. For example, the width of the insulation film 10 is within a range from 0.4 μm, inclusive, to 1.5 μm, inclusive.

Figure 11:
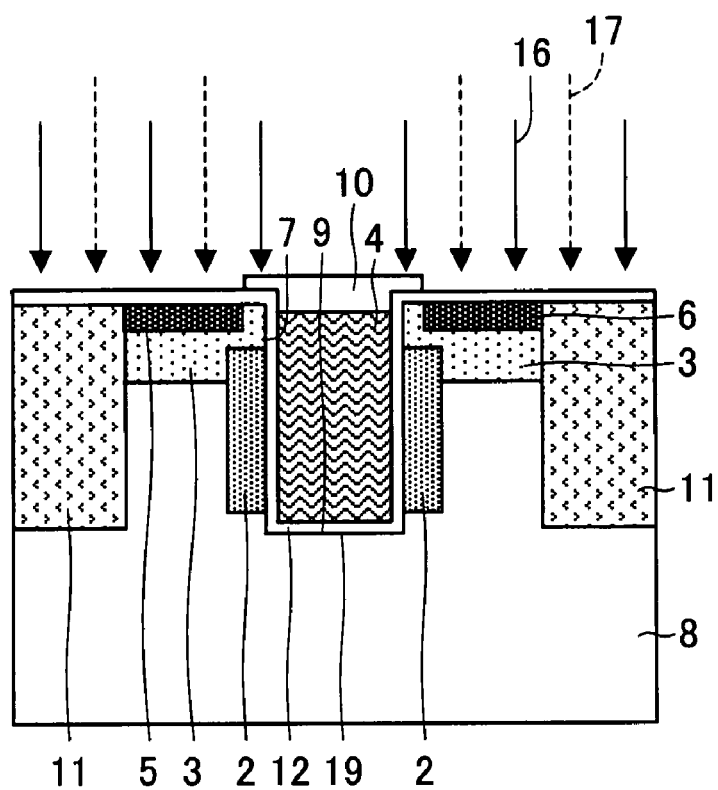
FIG. 11 is a cross sectional view taken along the line I-I for explaining the manufacturing method of the high withstand voltage transistor.

FIG. 11 is an explanatory diagram showing a manufacturing method of the high withstand voltage transistor 1. As shown in FIG. 11, a high concentration diffusion layer to become the source 5 and the drain 6 is formed as follows. The ion 16 is implanted using the insulation film 10 as a mask. Further, the ion 17 is implanted so as to penetrate the insulation film 10 and reach the electric field relaxation layer 2. Thus, the source 5, the drain 6, and the electric field relaxation layer 3 each of which is made of a high concentration diffusion layer are formed. Here, for example, the ion 16 is arsenic, and is implanted at 40 keV into an area of $5 \times 10^{15}$ cm$^2$. Further, for example, the ion 17 is phosphorous, and is implanted at 100 keV into an area of $4 \times 10^{12}$ cm$^2$.

Figure 12:
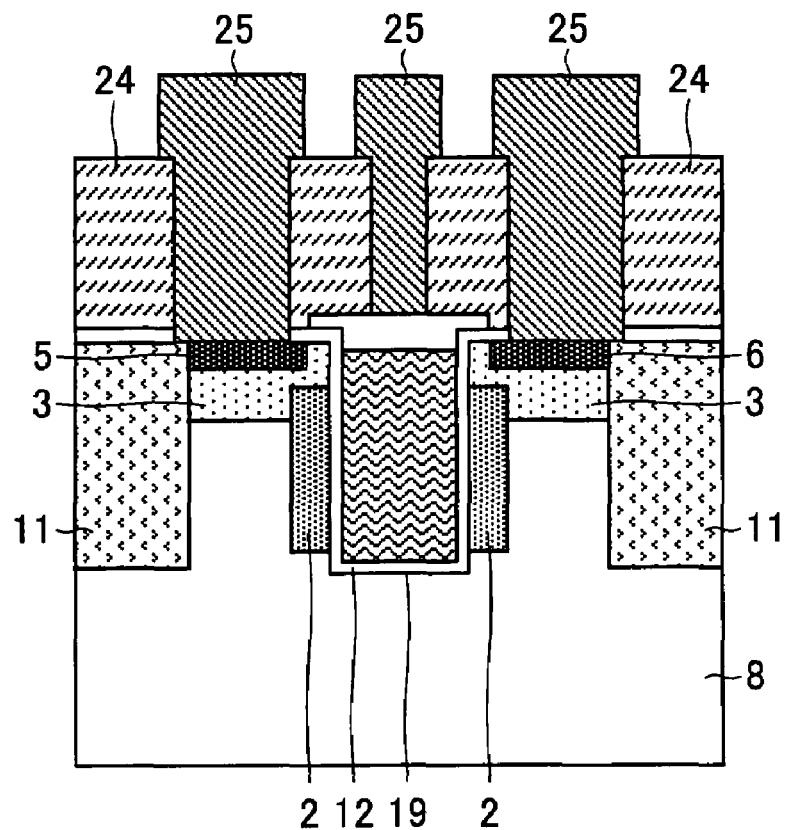
FIG. 12 is a cross sectional view taken along the line I-I for explaining the manufacturing method of the high withstand voltage transistor.

FIG. 12 is a cross sectional view taken along the line I-I for explaining a manufacturing method of the high withstand voltage transistor 1. After that, CVD oxidized films 24 are formed through a process of manufacturing a semiconductor device. Respective lines 25 connecting to the drain, the source and the gate electrode is formed. Thus, an N-type high withstand voltage transistor as shown in FIG. 12 is formed.

Then, through a formation of the high withstand voltage transistor of the above embodiment, the withstand voltage of the transistor and the junction withstand voltage at the source/drain diffusion region are made 30V.

It is possible to achieve the transistor withstand voltage and the drain/source junction withstand voltage which fall within a range from 10 to 100 V by modifying, according to the required withstand voltage, (i) distribution of the impurity concentration of the semiconductor substrate 8, (ii) the dimension (depth and width) of the trench 7, (iii) conditions of implanting ions 15, 16, and 17, and (iv) the thickness of the gate oxidized film 12. In this case, the depth of the trench 7 is 0.4 to 21 μm, the width of the trench 7 is 0.3 to 1 μm, the impurity concentration at a portion of the semiconductor substrate 8 nearby the electric field relaxation layer 3 formed by implantation of the ion 17 is $5 \times 10^{15}$ to $5 \times 10^{17}$ cm$^3$, the impurity concentration at a portion of the semiconductor substrate 8 nearby the bottom surface of the trench 7 is $1 \times 10^{15}$ to $1 \times 10^{17}$ cm$^3$, and the thickness of the gate oxidized film 12 is 28 to 300 nm.

Effect of Embodiment 1

The high withstand voltage transistor of the embodiment 1 can be significantly downsized while its withstand voltage is kept from being decreased.

Embodiment 2

Figure 13:
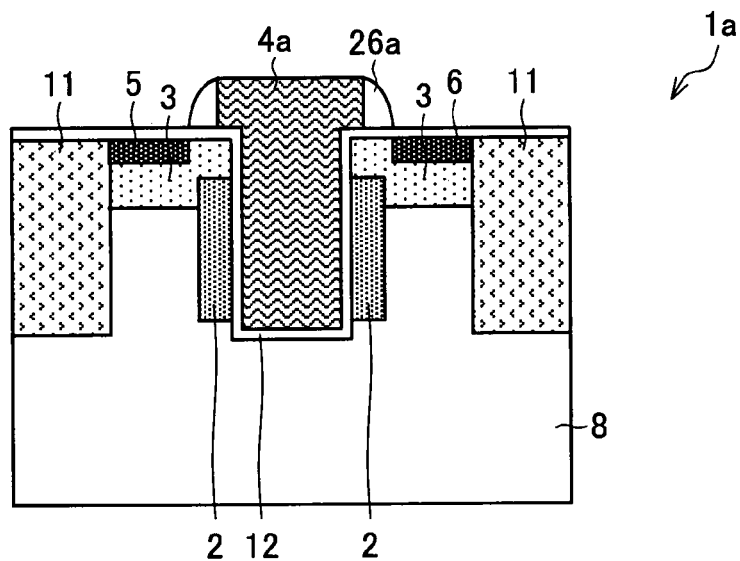
FIG. 13 is a cross sectional view of the embodiment which shows a configuration of an alternative form of the high withstand voltage transistor.

FIG. 13 is a cross sectional view showing a configuration of a high withstand voltage transistor 1a which is an alternative form of the present embodiment 2. The same symbols are given to members identical to those described hereinabove, and detailed explanations therefor are omitted here.

The high withstand voltage transistor 1a is provided with a gate electrode 4a. The gate electrode 4a is extended from inside the trench to regions of the semiconductor substrate adjacent to the trench, interposing a gate oxidized film between the gate electrode 4a and the semiconductor substrate. A side wall is formed on each of two sides of the extended portion of the gate electrode on the semiconductor substrate.

With this method, the distance between the gate electrode and source region (5) or the drain region (6) can be adjusted by controlling the width of the side wall, and therefore, it is possible to control withstand voltage between the gate electrode and the source region (5) or the drain region (6). As a result, a high withstand voltage can be achieved. As described, the gate electrode may be formed so as to project from the surface of the semiconductor substrate 8.

Effect of Embodiment 2

In the high withstand voltage transistor of the embodiment 2, a high concentration diffusion layer 6 and the gate electrode 4 are arranged apart from each other by an intended distance. A process of forming a CVD film 10 for preventing a decrease in the withstand voltage is eliminated. The gate electrode 4 is formed so that its extended portion outside the trench 7 is left unremoved. A side wall is formed on each of two sides of the gate electrode 4. That way, an effect similar to that of the embodiment 1 is obtained. However, the amount the high withstand voltage transistor can be downsized is reduced. This is because the extended portion of the gate electrode 4 outside the trench 7 is left unremoved.

Embodiment 3

Figure 14:
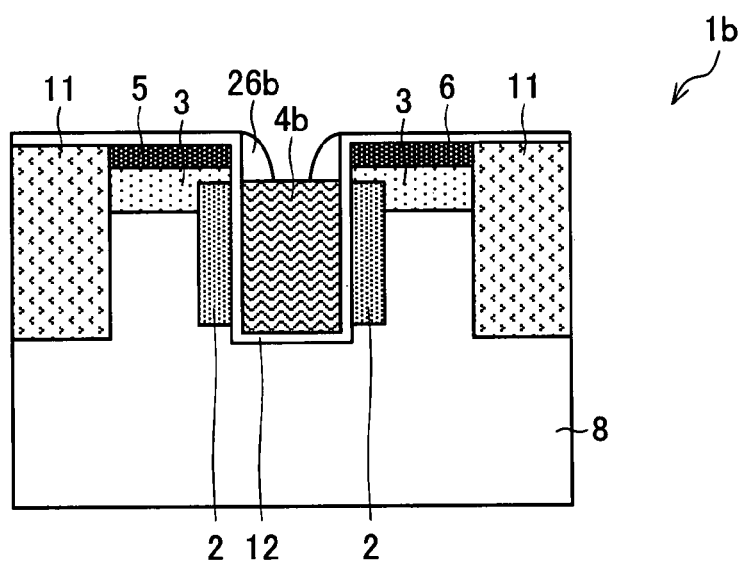
FIG. 14 is a cross sectional view of the embodiment which shows a configuration of another alternative form of the high withstand voltage transistor.

FIG. 14 is a cross sectional view showing a configuration of a high withstand voltage transistor 1b of the embodiment 3.

The high withstand voltage transistor 1b includes a gate electrode 4b which is formed as follows. Namely, on a semiconductor substrate, a gate oxidized film is formed on walls and a bottom surface of the trench which are exposed. Then, the gate electrode is formed so that its top is within the trench and is lower than a surface portion of the semiconductor substrate. A side wall is formed on the top surface of the gate electrode along walls on each of two sides of the trench. Thus, the distance between the gate electrode and source region (5) or the drain region (6) can be adjusted by controlling the width of the side wall and the position of the top portion of the gate electrode. This enables controlling of the withstand voltage between the gate electrode and the source region (5) or the drain region (6). As a result, a high withstand voltage can be achieved. As described, the gate electrode may be formed so as to be sunken down from the surface of the semiconductor substrate 8.

Effect of Embodiment 3

In the high withstand voltage transistor of the embodiment 3, the high concentration diffusion layer 6 and the gate electrode 4 are arranged apart from each other in the direction of the depth of the trench. Thus, it is possible to eliminate a process of forming a CVD film 10, and to obtain an effect similar to that of the embodiment 1 while preventing the withstand voltage of the transistor from decreasing and avoiding a decrease in the downsizing effect of the embodiment 1.

The embodiments shown in FIGS. 13 and 14 are alternative forms of the present invention which aims at preventing a decrease in the withstand voltage of the high withstand voltage transistor, by providing a second electric field relaxation layer between a gate electrode and a drain diffusion layer, and concentrating a strong electric field occurring between the gate electrode and the drain diffusion layer.

The above embodiments deal with an example where the present invention is applied to an N-type high withstand voltage transistor; however, the present invention is also applicable to a P-type high withstand voltage transistor as is the case of the N-type high withstand voltage transistor.

As described, in the present embodiment, a first trench 18 for element isolation is formed on a first conductive semiconductor substrate 8, and a CVD oxidized film 11 is buried in the first trench 18. The impurity concentration at a position of the semiconductor substrate which is 0.5 to 1 μm deeper than the bottom surface of the first trench 18 is set relatively high so that a punch-through withstand voltage between elements is ensured.

Further, to form a high withstand voltage transistor in a portion of the first trench 18, a photoresist in a transistor formation region is removed through a photo lithography. Then, after the first ion 15 of a second conduction type is implanted into the walls on two sides of the first trench 18 in the transistor formation region, the CVD oxidized film 11 in the first trench 18 of the transistor formation region is partially removed, thereby forming a second trench 7.

After that, a gate oxidized film 12 is formed by thermally oxidizing the walls and bottom surface of the second trench 7. Then a gate electrode 4 is buried into the second trench 7. The impurity concentration at the portion of the semiconductor substrate nearby the bottom surface of the second trench 7 is set so that the threshold voltage is set at an intended value.

An insulation film 10 having an intended width for covering the gate electrode 4 is formed. Then, to form the source 5 and drain 6 (high concentration diffusion layers), second ion 16 of a second conduction type is implanted using the insulation film 10 as a mask. Further, a third ion 17 of the second conduction type is implanted so as to form electric field relaxation layers 1 respectively on two sides of the gate electrode 4. The electric field relaxation layers 1 are positioned below two sides of the insulation film 10, and are extended below the source 5 and the drain 6 (high concentration diffusion layers), respectively.

On each side of the trench 7, the electric field relaxation layer 2 and the electric field relaxation layer 3 partially overlap each other, thereby forming a drift diffusion layer. The gate electrode 4 is apart from each of the source 5 and drain 6 (high concentration diffusion layers) by an amount masked by the extended portion of the insulation film 10.

Through the steps, the source 5 and drain 6 (high concentration diffusion layer) formed on sides of the gate electrode 4 buried in the trench 7 respectively serve as source and drain electrodes of the transistor. The drift diffusion regions for relaxing electric field are respectively formed in the inner walls on the two sides of the trench 7 (in regions respectively covered by two sides of the insulation film 10). A channel region of the transistor is formed on the bottom surface of the trench 7. Thus, a configuration of the high withstand voltage transistor is completed.

As shown in FIG. 2, each drain/source diffusion end B and the gate electrode end A are apart from each other by an amount the extended portions of the insulation film 10 mask implantation of the ion 16 for forming a high concentration diffusion layer. Thus, when a voltage is applied to the region between the drain and source of the high withstand voltage transistor having the above configuration, the electric field at the drift diffusion end B is hardly affected by the electric field at the gate electrode end A, and the breakdown voltage of the transistor is increased.

Further, the depletion layer is expanded perpendicularly to the walls of the trench 7, but is hardly expanded towards the bottom surface of the trench 7. This is because the impurity concentration in a portion of the semiconductor substrate 8 below the bottom surface of the trench 7 is set relatively high.

Accordingly, the punch-through withstand voltage of the transistor is hardly decreased even if the bottom surface of the trench 7 is downsized. Thus, a high punch-through withstand voltage is ensured even if the size of the transistor is made extremely small.

Thus, a transistor with an extremely high withstand voltage is realized with an extremely short gate length.

With a high withstand voltage transistor having the above-described configuration, an area of a surface of a semiconductor substrate for forming a drift diffusion layer (electric field relaxation layer) is made substantially zero, while avoiding a change in the function of the electric field relaxation. Thus, it is possible to provide a manufacturing method of a fine high withstand voltage transistor which yields a high withstand voltage with a short gate length.

Further, since it is not necessary to provide an ESD protection circuit for the output terminal and power source terminal, the chip size can be reduced by a large amount. Therefore, it is possible to provide a manufacturing method of a semiconductor device which is suitable for liquid crystal driver in which a large number of output terminals are required at a low cost.

As described, in the present embodiment, a trench is formed, and electric field relaxation layers are formed in the walls of the trench. Thus, an area on the semiconductor substrate taken by the electric field relaxation layer is made substantially zero, and an area taken by a high withstand voltage transistor can be reduced by a large amount (30 to 50%).

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

The present invention is applicable to: a high withstand voltage transistor, having a trench structure, for use in a liquid crystal driver or the like; and a method of manufacturing the high withstand voltage transistor.

Additionally, the high withstand voltage trenched MOS transistor of the present invention is preferably adapted so that: a plane on top of the gate electrode is substantially flush with the adjacent surface portions of the semiconductor substrate.

Additionally, the high withstand voltage trenched MOS transistor of the present invention is preferably adapted so that: the depth of the trench is within a range from 0.3 to 2 μm.

Additionally, the high withstand voltage trenched MOS transistor of the present invention is preferably adapted so that: the width of the trench is within a range from 0.3 to 1.0 μm.

Additionally, the high withstand voltage trenched MOS transistor of the present invention is preferably adapted so that: the impurity concentration of the first electric field relaxation layer is $1\times10^{16}$ to $5\times10^{17}$ cm$^{-3}$.

When the impurity concentration is not more than $1\times10^{16}$, the first electric field relaxation layers are depleted while the power source voltage of the transistor is supplied, and the withstand voltage of the transistor is decreased. On the other hand, when the impurity concentration is $5\times10^{17}$ cm$^{-3}$ or higher, avalanche breakdown takes place in the first electric field relaxation layer while the power source voltage of the transistor is supplied, and the withstand voltage of the transistor is decreased.

Additionally, the high withstand voltage trenched MOS transistor of the present invention is preferably adapted so that: the impurity concentration of the second electric field relaxation layer is $1\times10^{16}$ to $5\times10^{17}$ cm$^{-3}$.

When the impurity concentration is not more than $1\times10^{16}$, the second electric field relaxation layers are depleted while the power source voltage of the transistor is supplied, and the source/drain withstand voltage is decreased. On the other hand, when the impurity concentration is $5\times10^{17}$ cm$^{-3}$ or higher, avalanche breakdown takes place in the first electric field relaxation layer while the power source voltage of the transistor is supplied, and the source/drain withstand voltage is decreased.

Additionally, the high withstand voltage trenched MOS transistor of the present invention is preferably adapted so that: an end of each of the second electric field relaxation layers formed along the wall is in a position which is 80 to 90% of the depth of the trench.

When the depth of the end of the second electric field relaxation layer is in a position which is not more than 80% of the depth of the trench, the distance by which each second electric field relaxation layer is extended along the wall of the trench is shortened. This causes a decrease in the withstand voltage of the transistor. When the depth of the end of the second electric field relaxation layer is in a position which is 90% or more of the depth of the trench, the depletion layer expands towards the bottom surface of the trench when a voltage is applied to the transistor. This causes a decrease in the withstand voltage of the transistor.

Additionally, the high withstand voltage trenched MOS transistor of the present invention is preferably adapted so that: the width of the insulation film, for covering the gate electrode, in a gate length direction of the high withstand voltage trenched MOS transistor is between 0.4 and 1.5 μm.

When the width of the insulation film is not more than 0.4 μm, the transistor is easily affected by the electric field at the gate electrode, and the withstand voltage of the transistor is decreased. When the width of the insulation film is 1.5 μm or more, the size of the transistor is increased, and the on-resistance of the transistor is increased.

Additionally, the high withstand voltage trenched MOS transistor of the present invention is preferably adapted so that: a withstand voltage in the source region and the drain region of the high withstand voltage trenched MOS transistor is between 10 and 100V.

Additionally, the method of the present invention of manufacturing a high withstand voltage trenched MOS transistor is preferably adapted so that: a plane on top of the gate electrode is formed so as to be substantially flush with the adjacent surface portions of the semiconductor substrate.

Additionally, the method of the present invention of manufacturing a high withstand voltage trenched MOS transistor is preferably adapted so that: the depth of the trench is within a range from 0.3 to 2 μm.

Additionally, the method of the present invention of manufacturing a high withstand voltage trenched MOS transistor is preferably adapted so that: the width of the trench is within a range from 0.3 to 1.0 μm.

Additionally, the method of the present invention of manufacturing a high withstand voltage trenched MOS transistor is preferably adapted so that: the impurity concentration of the first electric field relaxation layer is $1\times10^{16}$ to $5\times10^{17}$ cm$^{-3}$.

Additionally, the method of the present invention of manufacturing a high withstand voltage trenched MOS transistor is preferably adapted so that: the impurity concentration of the second electric field relaxation layer is $1\times10^{16}$ to $5\times10^{17}$ cm$^{-3}$.

Additionally, the method of the present invention of manufacturing a high withstand voltage trenched MOS transistor is preferably adapted so that: an end of each of the second electric field relaxation layers formed along the wall is formed in a position which is 80 to 90% of the depth of the trench.

Additionally, the method of the present invention of manufacturing a high withstand voltage trenched MOS transistor is preferably adapted so that: the width of a second insulation film, for covering the gate electrode, in a gate length direction of the high withstand voltage trenched MOS transistor is between 0.4 and 1.5 μm.

Additionally, the method of the present invention of manufacturing a high withstand voltage trenched MOS transistor is preferably adapted so that a withstand voltage in the source region and the drain region of the high withstand voltage trenched MOS transistor is set between 10 and 100V.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A high withstand voltage trenched MOS transistor, comprising:
   a trench formed on a semiconductor substrate and a gate oxidized film formed in a surface portion of the trench;
   a gate electrode formed on the gate oxidized film in the trench;
   first electric field relaxation layers one of which is formed in a surface portion of the semiconductor substrate adjacent to one side of the gate electrode, and another one of which is formed in a surface portion of the semiconductor substrate adjacent to another side of the gate electrode;
   second electric field relaxation layers each of which is formed along a wall of the trench in a region having the gate electrode, and is connected to one of the first electric field relaxation layers;
   an insulation film covering the gate electrode; and
   a source region and a drain region one of which is formed so as to be included in a surface portion of one of the first electric field relaxation layers provided on the side of the gate electrode, and another one of which is formed so as to be included in a surface portion of another one of the first electric field relaxation layers provided on the other side of the gate electrode.

2. The high withstand voltage trenched MOS transistor as set forth in claim 1, wherein:
   a plane on top of the gate electrode is substantially flush with the adjacent surface portions of the semiconductor substrate.

3. The high withstand voltage trenched MOS transistor as set forth in claim 1, wherein:
   the depth of the trench is within a range from 0.3 to 2 μm.

4. The high withstand voltage trenched MOS transistor as set forth in claim 1, wherein:
   the width of the trench is within a range from 0.3 to 1.0 μm.

5. The high withstand voltage trenched MOS transistor as set forth in claim 1, wherein:
   the impurity concentration of the first electric field relaxation layer is $1 \times 10^{16}$ to $5 \times 10^{17}$ cm$^{-3}$.

6. The high withstand voltage trenched MOS transistor as set forth in claim 1, wherein:
   the impurity concentration of the second electric field relaxation layer is $1 \times 10^{16}$ to $5 \times 10^{17}$ cm$^{-3}$.

7. The high withstand voltage trenched MOS transistor as set forth in claim 1, wherein:
   an end of each of the second electric field relaxation layers formed along the inner wall is in a position which is 80 to 90% of the depth of the trench.

8. The high withstand voltage trenched MOS transistor as set forth in claim 1, wherein:
   the width of the insulation film, for covering the gate electrode, in a gate length direction of the high withstand voltage trenched MOS transistor is between 0.4 and 1.5 μm.

9. The high withstand voltage trenched MOS transistor as set forth in claim 1, wherein:
   a withstand voltage in the source region and the drain region of the high withstand voltage trenched MOS transistor is between 10 and 100V.

* * * * *